US007149316B1

(12) United States Patent
Kutz et al.

(10) Patent No.: US 7,149,316 B1
(45) Date of Patent: Dec. 12, 2006

(54) MICROCONTROLLER HAVING AN ON-CHIP HIGH GAIN AMPLIFIER

(75) Inventors: Harold Kutz, Snoquolmie, WA (US); Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 842 days.

(21) Appl. No.: 09/893,048

(22) Filed: Jun. 26, 2001

Related U.S. Application Data (60) Provisional application No. 60/243,708, filed on Oct. 26, 2000.

(51) Int. Cl.
*H03F 21/00* (2006.01)

(52) U.S. Cl. ...................... 381/120; 257/203
(58) Field of Classification Search ............... 381/120, 381/121; 257/204, 203, 208, 209; 700/94; 330/250, 251, 252, 253, 277, 307, 311
See application file for complete search history.

(56) References Cited

U.S. PATENT DOCUMENTS

| 4,608,502 | A | * | 8/1986 | Dijkmans et al. ............ 326/100 |
| 5,202,687 | A | | 4/1993 | Distinti ...................... 341/158 |
| 5,248,843 | A | * | 9/1993 | Billings ........................ 84/609 |
| 5,900,780 | A | * | 5/1999 | Hirose et al. ................ 330/253 |
| 5,973,368 | A | * | 10/1999 | Pearce et al. ................ 381/120 |
| 6,051,772 | A | * | 4/2000 | Cameron et al. ............. 84/624 |
| 6,079,985 | A | * | 6/2000 | Wohl et al. .................. 434/319 |
| 6,144,327 | A | | 11/2000 | Distinti et al. .............. 341/126 |
| 6,373,954 | B1 | * | 4/2002 | Malcolm et al. .............. 700/94 |
| 6,460,172 | B1 | * | 10/2002 | Insenser Farre et al. ...... 716/17 |
| 6,850,117 | B1 | * | 2/2005 | Weber et al. ................ 330/277 |

* cited by examiner

*Primary Examiner*—Stella Woo (57) ABSTRACT

A microcontroller includes a wide band, high gain amplifier on-chip capable of driving a 32 ohm speaker. The amplifier is controllable by the microcontroller processor to either enable or disable the amplifier and switch between multiple modes of power. In one embodiment, one or more such amplifiers are situated anywhere on the integrated circuit die including at the corners of the die.

20 Claims, 6 Drawing Sheets

MICROCONTROLLER HAVING AN ON-CHIP HIGH GAIN AMPLIFIER

CROSS REFERENCE TO RELATED DOCUMENTS

This application is related to and claims priority benefit under 35 U.S.C. §119(e) of U.S. Provisional Patent Application Ser. No. 60/243,708, filed Oct. 26, 2000 to Snyder, et al. which is hereby incorporated herein by reference. This application is also related to Ser. No. 09/893,050, filed on the same date herewith, to Kutz et al, entitled "Multiple Use of Microcontroller Pad" which is hereby incorporated by reference.

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

FIELD OF THE INVENTION

This invention relates generally to the field of integrated circuit microcontrollers. More particularly, this invention relates to a microcontroller having an integral analog amplifier.

BACKGROUND OF THE INVENTION

Microcontrollers have become popular integrated circuits due to their versatility in applying computer controlling all types of devices. A high degree of versatility is, thus, prized in such microcontrollers. However, most such microcontrollers are digital devices designed to interface with external circuitry to adapt to an analog world. This often increases the cost of use of such devices due to the need to provide analog to digital and digital to analog conversion as well as providing separate circuitry to handle even simple analog functions.

SUMMARY OF THE INVENTION

The present invention relates generally to an integrated circuit microcontroller. Objects, advantages and features of the invention will become apparent to those skilled in the art upon consideration of the following detailed description of the invention.

In one embodiment consistent with the present invention, a microcontroller includes a wide band, high gain amplifier on-chip capable of driving a 32 ohm speaker. The amplifier is controllable by the microcontroller processor to either enable or disable the amplifier and switch between multiple modes of power. In one embodiment, one or more such amplifiers are situated on the integrated circuit die at the corners of the die. This provides the advantages, in certain embodiments, of utilization of generally unused die area to provide the function of an audio amplifier driver to enhance the versatility of the microcontroller.

A microcontroller chip consistent with certain embodiments of the present invention includes a processor for executing program instructions. An array of configurable digital circuit blocks configured to perform a digital circuit function while an array of configurable analog circuit blocks configured to perform an analog circuit function, such analog circuit blocks are configured to produce an analog output signal. An on-chip CMOS analog amplifier having an input receiving the analog output signal and producing an amplified output signal suitable for driving loudspeaker external to the microcontroller chip.

In another embodiment consistent with the present invention, a microcontroller chip includes a processor for executing program instructions. An array of configurable circuit blocks configured to perform a circuit function, such circuit blocks configured to produce an analog output signal. An on-chip analog amplifier having an input receiving the analog output signal and producing an amplified output signal suitable for driving a loudspeaker external to the microcontroller chip.

The above summaries are intended to illustrate exemplary embodiments of the invention, which will be best understood in conjunction with the detailed description to follow, and are not intended to limit the scope of the appended claims.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 1:
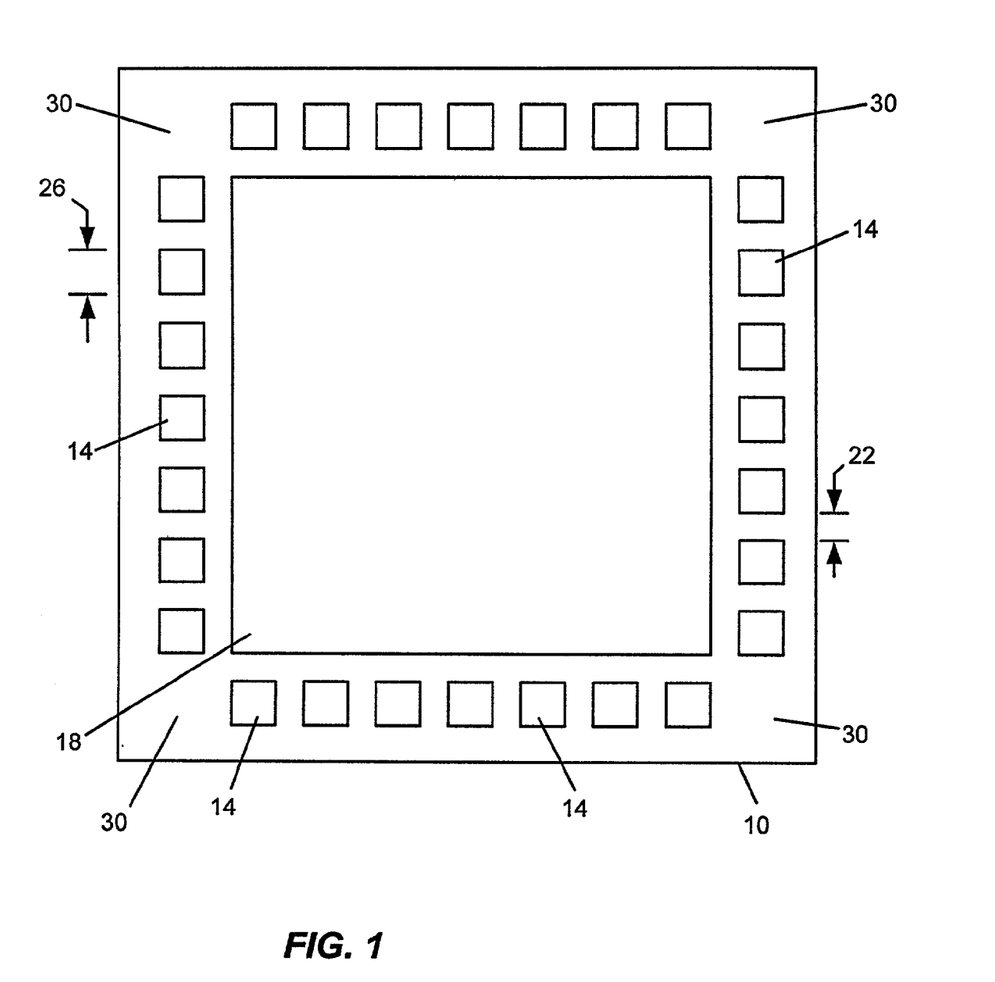
FIG. 1 is an exemplary layout of an integrated circuit die.

Turning now to FIG. 1, an integrated circuit die 10 is illustrated. Die 10 includes a plurality of wirebonding pads 14 (which are typically used for providing a wirebond or soldered electrical connection to the integrated circuit) situated around a periphery of the die 10. The pads 14 are separated by a separation distance 22 defined generally by the resolution of the circuit's manufacturing process and the circuit layout. Pads 14 are shown symmetrically disposed around the periphery in this illustration, but this is not generally a requirement. The pads 14 are also generally of a particular geometry, generally square with a minimum size 26 as shown, but other shapes are also used.

In the classic manufacturing process, an array of such dies are produced on a wafer of silicon. The dies are then separated from one another by cutting or breaking at a scribe line. During this process, the corner areas 30 of the die have historically been exposed to substantial amounts of mechanical stress and may fracture or break in the separation process. However, gradual improvements in the technology of separation of the dies has substantially lessened the stress and incidence of fractures in this region.

Figure 2:
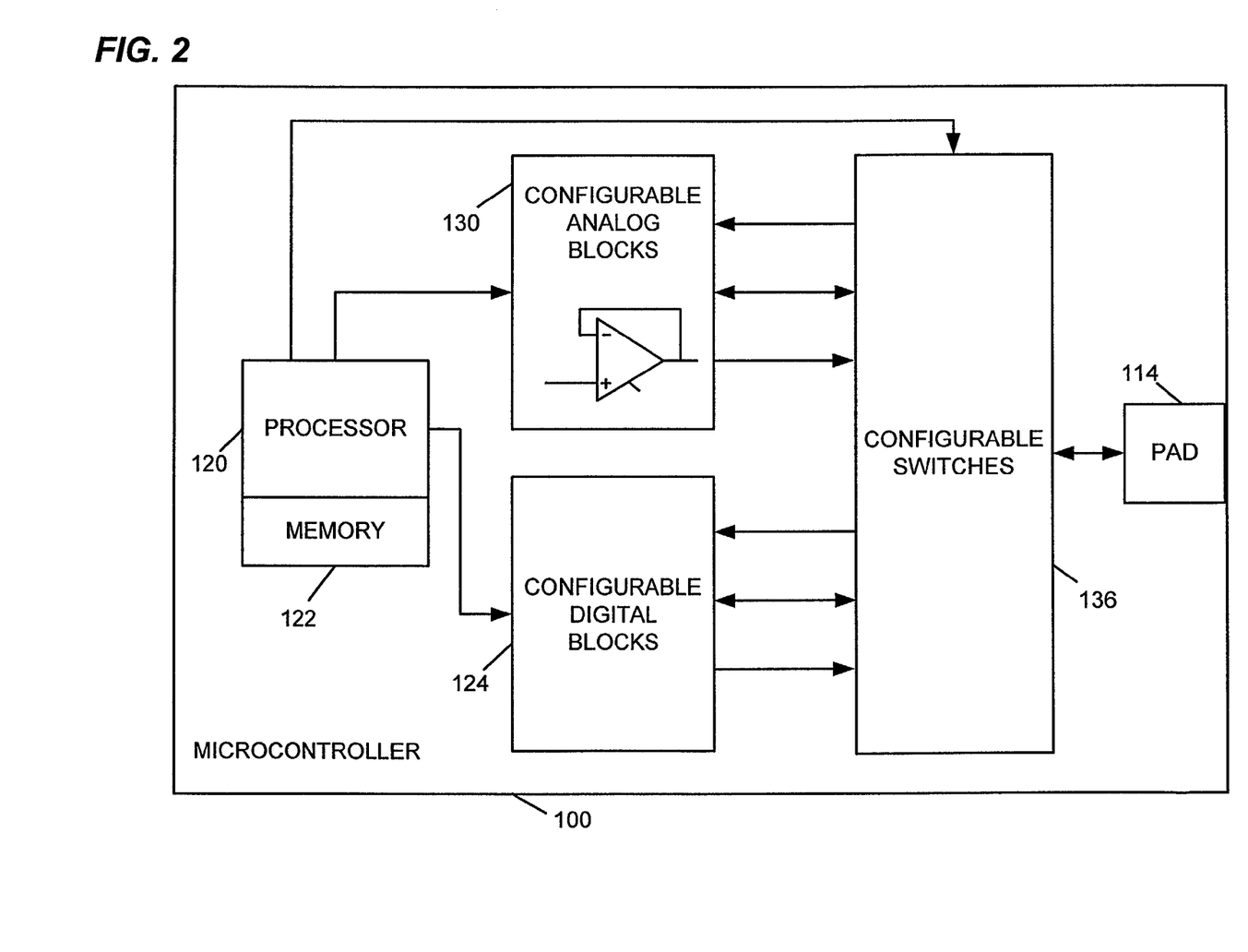
FIG. 2 is an overall block diagram of a microcontroller consistent with an exemplary embodiment of the present invention.

In order to maximize the versatility of the circuit arrangement of the present invention, a microcontroller 100 as illustrated in FIG. 2 utilizes one or more multi-purpose pads 114. Microcontroller 100 includes a processor 120 that can be programmed for a specified purpose by or for a user. Program instructions for carrying out such a specified purpose, along with information defining a configuration of circuitry contained on the microcontroller 100 is stored in various forms of memory represented as 122. A plurality of digital circuits are provided to form configurable digital blocks 124. These configurable digital blocks 124 can include gates, counters, buffers, latches, decoders, encoders, registers, flip-flops, timers, etc. that can be user configured in any suitable arrangement to implement a user's desired circuit configuration. Similarly, a plurality of analog circuits are provided to form configurable analog blocks 130. These configurable analog blocks may include filters, amplifiers, switches, clippers, limiters, summers, buffers, etc. that can be interconnected in a suitable arrangement to implement the user's desired circuit configuration.

Figure 3:
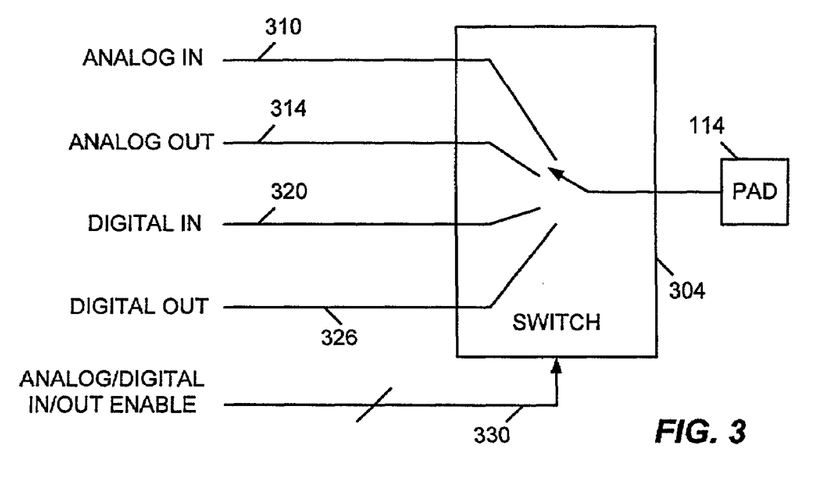
FIG. 3 illustrates a first switching arrangement for configuring a wirebond pad consistent with an embodiment of the invention.
Figure 4:
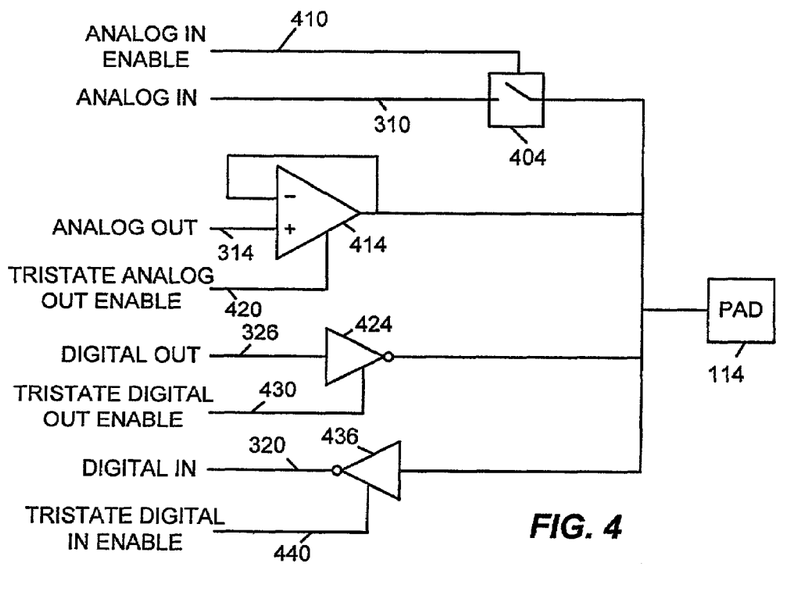
FIG. 4 illustrates a second switching arrangement for configuring a wirebond pad consistent with an embodiment of the invention.

The inputs and outputs for the configurable digital blocks 124 and configurable analog blocks 130 are coupled to a plurality of configurable switches 136 to be routed to the multi-purpose pad 114. These switches are programmed by the user or at manufacture through the processor 120 and can be arranged in a number of ways to provide multiple use of the pad 114 to provide a uni-directional or bi-directional signal path as illustrated. The memory 122 stores the configuration information associated with the desired configuration. The switching arrangement illustrated in FIG. 3 is somewhat conceptual and can be implemented in any number of ways as illustrated in the co-pending application to Kutz et al. described above. FIGS. 3–4 illustrate several techniques for implementation of such switching as described in the co-pending application to Kutz et al which is incorporated by reference.

FIG. 3 illustrates a first circuit arrangement that can be utilized to implement the switching function of configurable switches 136. In this embodiment, an electronic switch circuit 304 can be used. Switch circuit 304 can be realized with, for example, a plurality of CMOS analog switches with one side of each switch connected together at a common junction. Switch 304 is connected to an analog input 310, an analog output 314, a digital input 320 and a digital output 326—any of which can be connected to pad 114 depending upon the switch position. The switch position can be determined by a control bus 330 that serves to enable one of the desired connections (e.g., by selectively turning on one of the CMOS analog switches) and thus complete the circuit to pad 114. The switch can be configured under the control of the processor 120 as either analog or digital, input or output.

In another embodiment illustrated in FIG. 4, an analog input (to the microcontroller through pad 114) can be selectively switched to 310 using an analog switch 404 operating under control of an analog in enable control line 410 that turns switch 404 on or off as desired to implement a connection to pad 114. An analog output from the microcontroller 100 can be selectively provided using tristate buffer amplifier 414. The analog out signal at 314 to be supplied to pad 114 is supplied to the non-inverting input of a voltage follower configured operational amplifier. The amplifier can be selectively enabled using tristate control at a tristate analog out enable line 420. Tristate control can similarly be used to control digital out signal 326 through a tristate inverter 424. The output of the tristate inverter 424 is connected to pad 114 and it can be effectively removed from the circuit or switched on using tristate control applied by tristate digital out enable signal 430 to control whether or not the inverter is enabled or "tri-stated". Tristate control can similarly be used to control digital in signal 320 through a tristate inverter 436. The high impedance input of the tristate inverter 436 is connected to pad 114 and it can be effectively removed from the circuit or switched on using tristate control applied by tristate digital in enable signal 440 to control whether or not the inverter is enabled or disabled (tri-stated). In this embodiment, the pad 114 is isolated from the circuitry within the microcontroller by the high impedance of a tristate controlled gate or an analog switch in the off position to thus prevent unnecessary loading. Again, the switching arrangement can be configured under the control of the processor 120 as either analog or digital, input or output.

Figure 5:
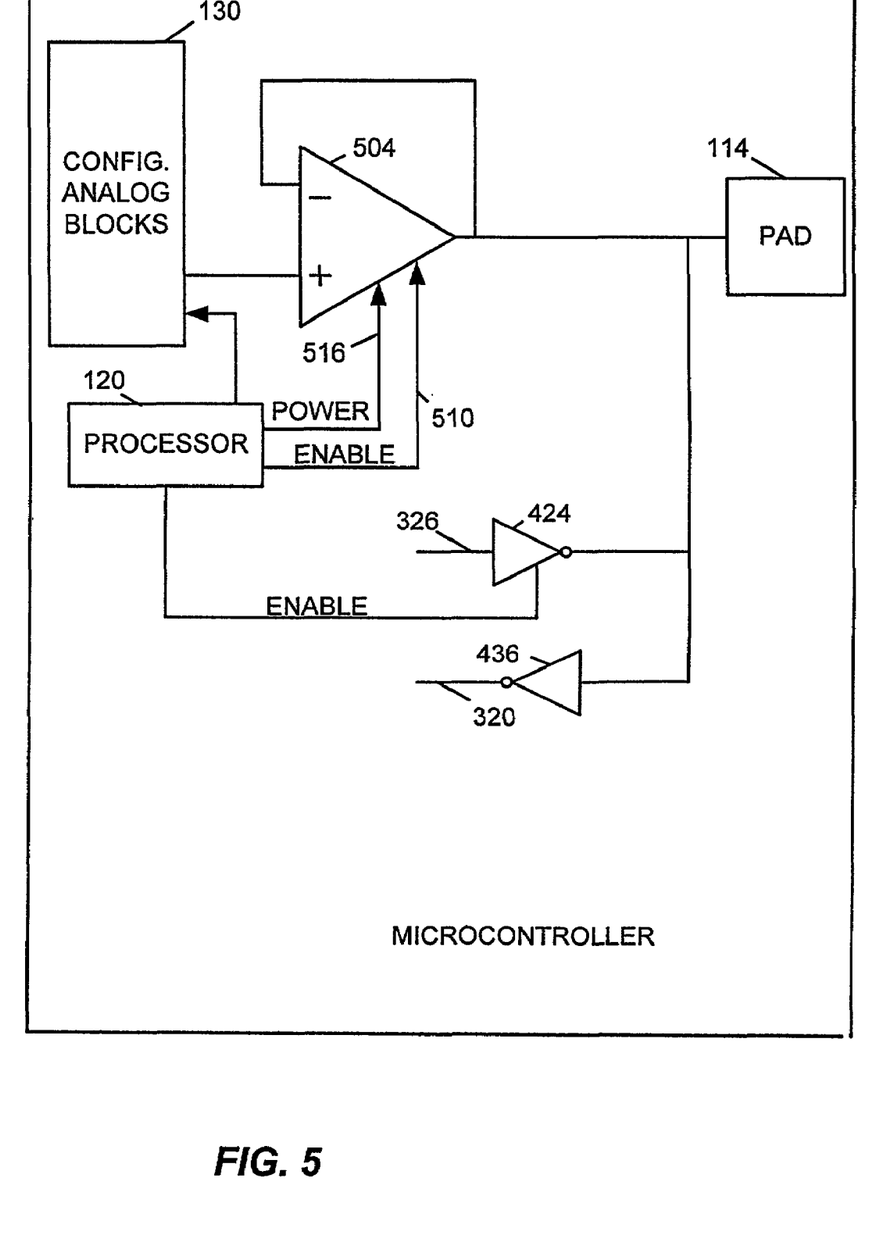
FIG. 5 is a block diagram showing the analog amplifier operating under control of the processor consistent with an embodiment of the invention.

Referring now to FIG. 5, a portion of microcontroller 100 is illustrated in connection with a high gain analog amplifier 504 that receives an analog input signal from a circuit configured from configurable analog blocks 130, consistent with an embodiment of the present invention. In this embodiment, the on-chip analog amplifier is realized as a tristate CMOS power amplifier of more or less conventional CMOS op-amp design with high current output transistors. The amplifier 504 has variable power level (and may also have variable gain) and has its output connected to pad 114. As illustrated in FIG. 4 and the co-pending Kutz et al. application generally, pad 114 can be a multiple function wirebond pad capable of connection to digital circuits through gates 436 or 424 as well as analog amplifier 504. Processor 120 can enable or disable the analog amplifier through tristate control (or any other suitable mechanism) by enable line 510 and can control the power of the amplifier by power control line 516 in the preferred embodiment.

Figure 6:
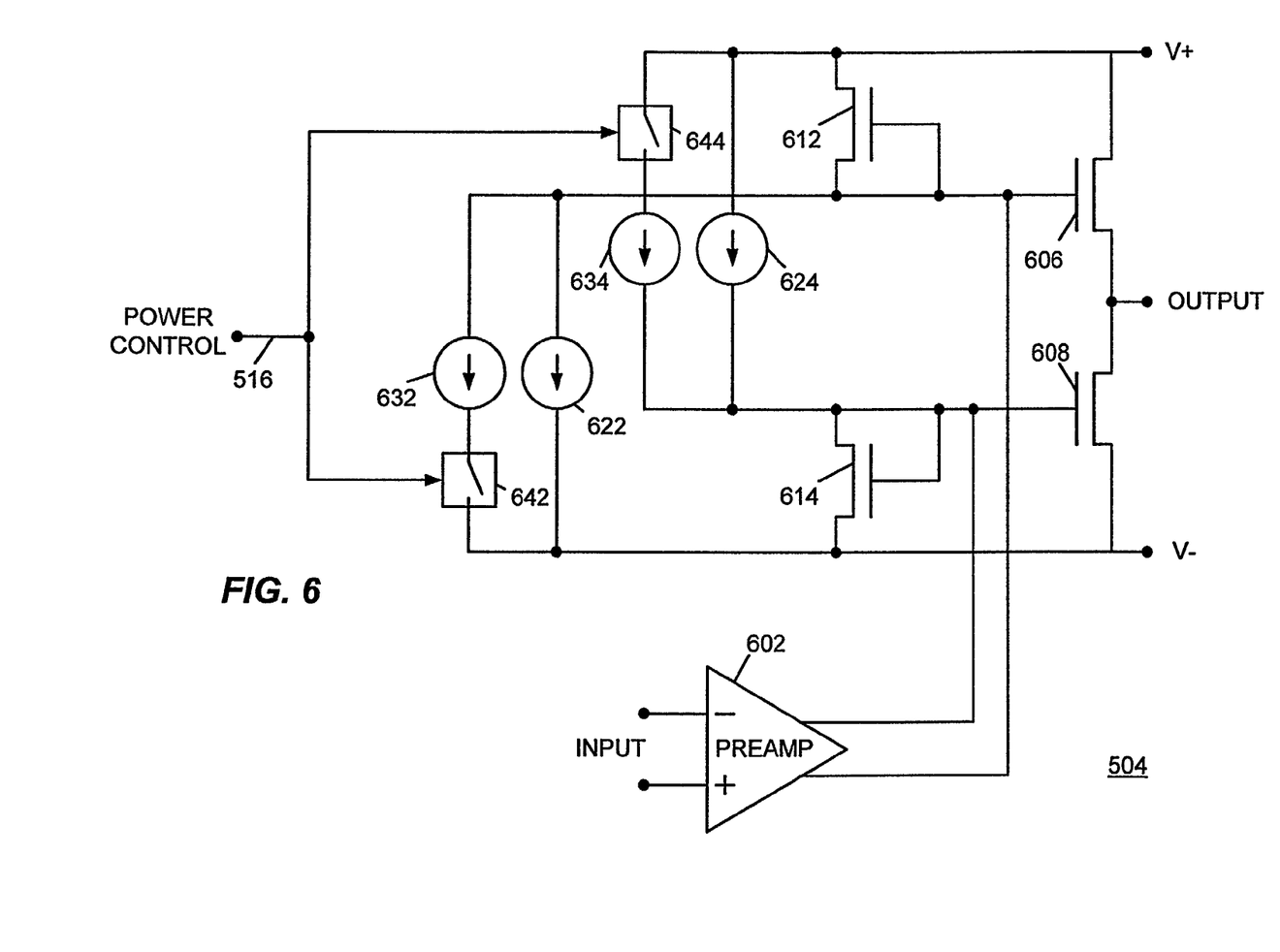
FIG. 6 is a schematic illustrating a circuit arrangement for the analog amplifier consistent with an embodiment of the invention.

With reference to FIG. 6, a more detailed, but nonetheless simplified, view of CMOS amplifier 504 is presented illustrating one embodiment for implementation of such an amplifier. Amplifier 504 preferably has one or more preamplifier stages shown as 602 which may be implemented as either single ended or differential as shown. In the preferred embodiment, a total of three stages of amplification is provided in a more or less conventional CMOS op-amp configuration. The differential output of the pre-amplifier 602 drives the power amplifier stage represented by the remainder of the circuit of FIG. 6. The power amplifier includes a differential output stage made up of transistors 606 and 608 with gates driven by pre-amplifier 602. The gates of transistors 606 and 608 are biased in a conventional manner using diode connected transistors 612 and 614 in series with current sources 622 and 624 respectively with the gates attached at the junctions of the diode connected transistors and the current sources.

In addition to the above bias arrangement, a second set of current sources 632 and 634 are switchably connected in parallel with current sources 622 and 624 respectively. Current sources 632 and 634 are selectively enabled by power control line 516. When power control 516 is enabled, a pair of CMOS transistor switches 642 and 644 close to place current source 632 in parallel with current source 622 and current source 634 in parallel with current source 624, thus increasing the bias current to transistors 606 and 608 and increase the current gain thereof. In this manner, the power of the power amplifier can be selected to have a lower value to conserve power or a higher power to drive a greater load. In one embodiment, the output transistors 606 and 608 are sized to produce enough current to drive a 32 ohm loudspeaker. The switching of the current drive to the output transistors can, of course, be extended to more current sources and switches to provide greater degrees of control over the amplifier's current gain. Tristate control (not illustrated) can be used to enable or disable the amplifier 504 under control of processor 120.

The amplifier 504 consistent with certain embodiments of the present invention provides a high drive level (e.g., suitable for driving an audio loudspeaker without additional parts) and low distortion embodied within a microcontroller die. Thus, the microcontroller can directly drive an audio loudspeaker, provide digital to analog converter buffering, provide buffering for on-chip or off chip filtering, provide buffering for other analog signal processing circuits as well as providing numerous other configurable applications as will occur to those skilled in the art.

Figure 7:
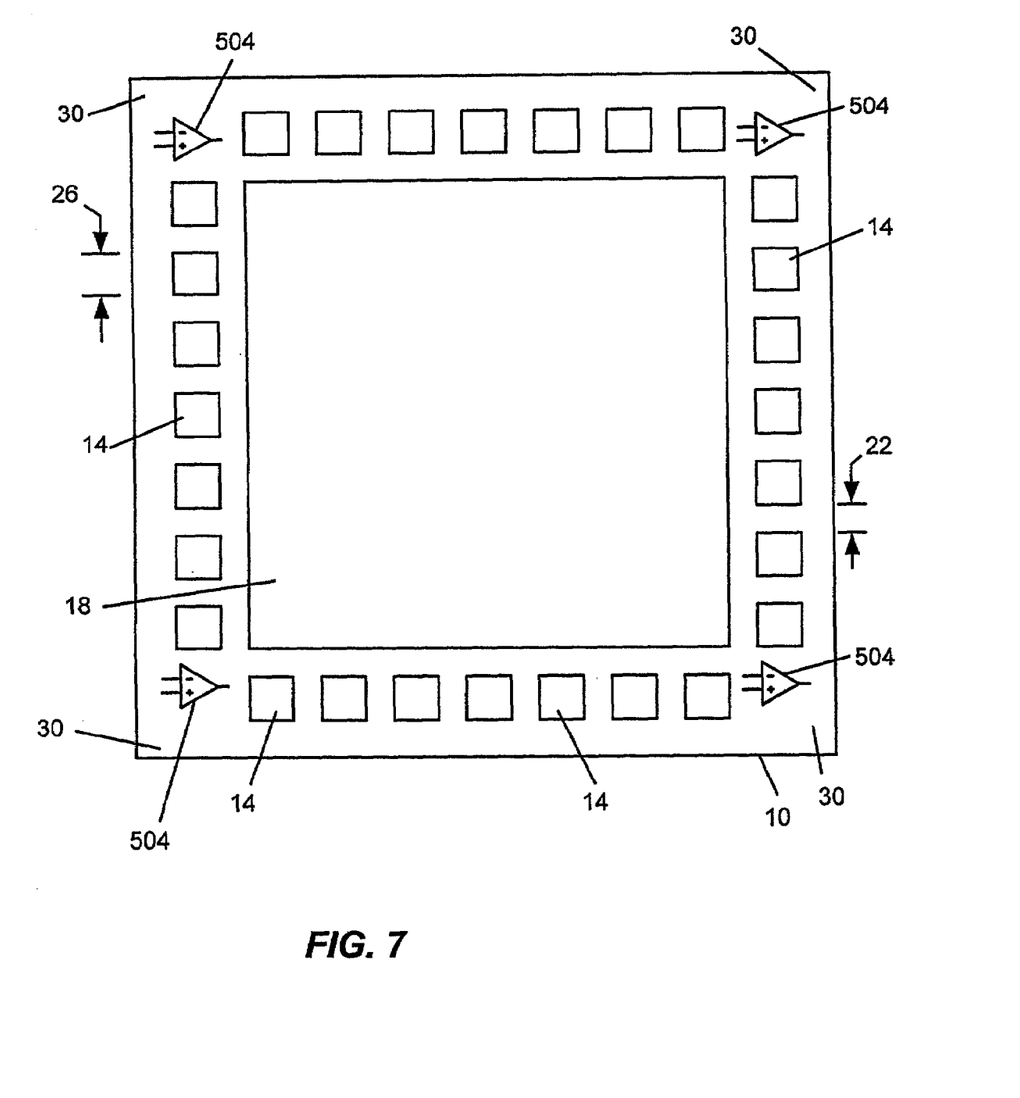
FIG. 7 illustrates the location of the analog amplifier according to an embodiment of the invention.

Referring now to FIG. 7, one or more of amplifiers 504 can be situated on the die 10 adjacent the corners 30 as illustrated. The technology for separating the individual integrated circuit die from wafers has progressed by use of sawing, laser cutting and other technologies has rendered the corners 30 much less susceptible to damage than in the past. Although this progress has been made, the corners still remain largely unused, most design guidelines forbid circuitry in the corners. Since the amplifiers 504 can take a significant amount of die area to realize, use of generally unused portions of the die provide an opportunity to minimize the impact of adding such amplifiers to the microcontroller circuit. Moreover, the corner-most wirebond pads are readily accessed as output, power or ground pads for the amplifiers in certain embodiments.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A microcontroller chip, comprising:
   a processor for executing program instructions;
   an array of configurable circuit blocks configured to perform a circuit function, such circuit blocks configured to produce an analog output signal; and
   an on-chip analog amplifier having an input receiving the analog output signal and producing an amplified output signal suitable for driving a loudspeaker external to the microcontroller chip.

2. The apparatus according to claim 1, wherein the microcontroller chip has four corners, and wherein the on-chip analog amplifier is situated adjacent one of the four corners.

3. The apparatus according to claim 1, further comprising a switchable current source for selectively providing an increase in bias current to the on-chip analog amplifier under control of the processor.

4. The apparatus according to claim 1, wherein the on-chip analog amplifier comprises a tristatable CMOS analog amplifier.

5. The apparatus according to claim 4, wherein the CMOS analog amplifier comprises a tristate CMOS analog amplifier.

6. The apparatus according to claim 5, wherein a tristate mode of the tristate CMOS analog amplifier is selectably controlled by the processor.

7. The apparatus according to claim 1, wherein the on-chip analog amplifier produces an amplified output signal suitable for driving a 32 ohm loudspeaker external to the microcontroller chip.

8. The apparatus according to claim 1, wherein the array of configurable circuit blocks comprise an array of analog circuit blocks and an array of digital circuit blocks.

9. The apparatus according to claim 8, further comprising a wirebond pad, and wherein the amplified output signal is directed to an external loudspeaker via the wirebond pad.

10. The apparatus according to claim 9, further comprising switching means coupled to the wirebonding pad that selectively disables a connection between the configurable circuit blocks and the wirebond pad under processor control.

11. A microcontroller chip, comprising:
    a processor for executing program instructions;
    an array of configurable digital circuit blocks configured to perform a digital circuit function;
    an array of configurable analog circuit blocks configured to perform an analog circuit function, such analog circuit blocks configured to produce an analog output signal; and
    an on-chip CMOS analog amplifier having an input receiving the analog output signal and producing an amplified output signal suitable for driving a loudspeaker external to the microcontroller chip.

12. The apparatus according to claim 11, wherein the microcontroller chip has four corners, and wherein the on-chip analog amplifier is situated adjacent one of the four corners.

13. The apparatus according to claim 11, further comprising a switchable current source for selectively providing an increase in bias current to the on-chip analog amplifier under control of the processor.

14. The apparatus according to claim 11, wherein the on-chip analog amplifier comprises a CMOS analog amplifier.

15. The apparatus according to claim 14, wherein a tristate mode of the tristate CMOS analog amplifier is selectably controlled by the processor.

16. The apparatus according to claim 11, wherein the on-chip analog amplifier produces an amplified output signal suitable for driving a 32 ohm loudspeaker external to the microcontroller chip.

17. The apparatus according to claim 11, further comprising a wirebond pad, and wherein the amplified output signal is directed to an external loudspeaker via the wirebond pad; and further comprising switching means coupled to the wirebonding pad that selectively disables a connection between the configurable analog and digital circuit blocks and the wirebond pad under processor control.

18. A microcontroller chip, comprising:
- a processor for executing program instructions;
- an array of configurable digital circuit blocks configured to perform a digital circuit function;
- an array of configurable analog circuit blocks configured to perform an analog circuit function, such analog circuit blocks configured to produce an analog output signal;
- an on-chip tristateable CMOS analog amplifier having an input receiving the analog output signal and producing an amplified output signal suitable for driving a loudspeaker external to the microcontroller chip, wherein a tristate mode of the tristate CMOS analog amplifier is selectably controlled by the processor;
- a switchable current source for selectively providing an increase in bias current to the on-chip analog amplifier under control of the processor;
- wherein the microcontroller chip has four corners, and wherein the on-chip analog amplifier is situated adjacent one of the four corners.

19. The apparatus according to claim 18, further comprising a wirebond pad, and wherein the amplified output signal is directed to an external loudspeaker via the wirebond pad.

20. The apparatus according to claim 19, further comprising switching means coupled to the wirebonding pad that selectively disables a connection between the configurable circuit blocks and the wirebond pad under processor control.

* * * * *